(12) United States Patent
Castaldi et al.

(10) Patent No.: US 9,607,831 B2
(45) Date of Patent: Mar. 28, 2017

(54) METHOD FOR DEPOSITING AN ALUMINIUM NITRIDE LAYER

(71) Applicant: Oerlikon Advanced Technologies AG, Balzers (LI)

(72) Inventors: Lorenzo Castaldi, Galgenen (CH); Martin Kratzer, Feldkirch (AT); Heinz Felzer, Landquart (CH); Robert Mamazza, Jr., Buchs (CH); Bernd Heinz, Buchs (CH)

(73) Assignee: EVATEC AG, Trubbach (CH)

( * ) Notice: Subject to any disclaimer, the term of this patent is extended or adjusted under 35 U.S.C. 154(b) by 77 days.

(21) Appl. No.: 14/633,639

(22) Filed: Feb. 27, 2015

(65) Prior Publication Data

US 2015/0179430 A1    Jun. 25, 2015

Related U.S. Application Data

(63) Continuation of application No. PCT/IB2013/058101, filed on Aug. 29, 2013.
(Continued)

(51) Int. Cl.
*H01L 21/02* (2006.01)
*C30B 29/40* (2006.01)
(Continued)

(52) U.S. Cl.
CPC .......... *H01L 21/0254* (2013.01); *C30B 25/06* (2013.01); *C30B 25/186* (2013.01);
(Continued)

(58) Field of Classification Search
CPC ........... H01L 21/0254; H01L 21/02381; H01L 21/02433; H01L 21/02631;
(Continued)

(56) References Cited

U.S. PATENT DOCUMENTS

| 5,633,194 A | 5/1997 | Selvakumar |
| 5,759,360 A | 6/1998 | Ngan |

(Continued)

FOREIGN PATENT DOCUMENTS

| DE | 100 06 108 A1 | 8/2001 |
| EP | 0 421 430 A2 | 4/1991 |

(Continued)

OTHER PUBLICATIONS

International Search Report for PCT/IB2013/058101 dated Dec. 10, 2013.
Singapore Written Opinion for 11201500330V dated Mar. 15, 2016.

*Primary Examiner* — Armando Rodriguez
(74) *Attorney, Agent, or Firm* — Pearne & Gordon LLP

(57) ABSTRACT

A method for depositing an aluminium nitride layer on a substrate is provided that comprises: providing a silicon substrate; placing the substrate in a vacuum chamber; conditioning a surface of the substrate by etching and providing a conditioned surface; depositing an aluminum film onto the conditioned surface of the substrate by a sputtering method under an atmosphere of Argon and depositing an epitaxial aluminium nitride layer on the aluminum film by a sputtering method under an atmosphere of Nitrogen and Argon.

19 Claims, 2 Drawing Sheets

Related U.S. Application Data

(60) Provisional application No. 61/695,551, filed on Aug. 31, 2012.

(51) Int. Cl.
*C30B 25/06* (2006.01)
*C30B 25/18* (2006.01)
*H01L 21/3065* (2006.01)

(52) U.S. Cl.
CPC ...... *C30B 29/403* (2013.01); *H01L 21/02381* (2013.01); *H01L 21/02433* (2013.01); *H01L 21/02491* (2013.01); *H01L 21/02631* (2013.01); *H01L 21/02661* (2013.01); *H01L 21/3065* (2013.01)

(58) Field of Classification Search
CPC ........... H01L 21/02661; H01L 21/3065; C30B 25/06; C30B 25/186; C30B 29/403
See application file for complete search history.

(56) References Cited

U.S. PATENT DOCUMENTS

| | | |
|---|---|---|
| 6,255,179 B1 | 7/2001 | Cantell |
| 6,391,748 B1 | 5/2002 | Temkin |
| 2004/0230271 A1* | 11/2004 | Wang ................ A61M 25/0045 607/116 |
| 2006/0124956 A1 | 6/2006 | Peng |
| 2010/0176369 A2 | 7/2010 | Oliver |

FOREIGN PATENT DOCUMENTS

| | | | |
|---|---|---|---|
| EP | 0421430 | * | 10/2003 |
| WO | 2011/066518 A1 | | 6/2011 |

* cited by examiner

METHOD FOR DEPOSITING AN ALUMINIUM NITRIDE LAYER

A method for depositing an aluminium nitride layer is described herein.

AlGaN/GaN based semiconductors are used in various devices such as light emitting diodes, laser diodes, photovoltaic solar cells and power devices such as high electron mobility transistors.

The basic structure of a light emitting diode (LED) corresponds to a pn-semiconductor diode so that they exhibit comparable characteristics. A difference lies in the semiconductor materials used for LEDs. While non-luminescent diodes are manufactured from silicon, or sometimes germanium or selenium, the semiconductor material for LEDs is a III-V semiconductor, usually a gallium compound.

If a voltage is applied in a forward direction, electrons migrate from the n-doped to the p-doped side of the LED and light is emitted. The wavelength of the light emitted, and thus its color, depends on the band gap energy of the materials forming the pn-junction. In silicon or germanium diodes, the electrons and holes recombine by a non-radiative transition, which produces no optical emission, because these are indirect band gap materials. The materials used for the LED have a direct band gap with energies corresponding to near-infrared, visible, or near-ultraviolet light.

LEDs are usually built on an n-type substrate, with an electrode attached to the p-type layer deposited on its surface. P-type substrates, while less common, are used as well. Some commercial LEDs, especially GaN/InGaN, use a silicon substrate.

The large lattice mismatch between GaN and silicon substrates can be matched by using multiple growth steps to accommodate the lattice strain and enable the growth of high quality GaN films.

An intermediate epitaxially grown AlN layer may be deposited on the substrate and serves as a template upon which GaN can be grown, due to the smaller lattice mismatch between AlN and silicon substrates. Therefore, the use of an AlN buffer layer may be used to bypass the challenging nucleation steps needed for the MOCVD process to grow GaN on various substrates, such as silicon.

U.S. Pat. No. 6,391,748 B1 discloses an epitaxial film forming method capable of fabricating an aluminium nitride layer on a silicon substrate by molecular beam epitaxial growth. The AlN layer is initially grown by subjecting the silicon substrate to background ammonia followed by repetitively alternating the flux of 1) Al without ammonia and 2) ammonia without Al. After the surface of the silicon structure is sufficiently covered with AlN, the wafer is further subjected to a flux of ammonia and aluminum applied simultaneously to continue the epitaxial growth process. The process minimizes the formation of amorphous silicon nitride, $SiN_x$, compounds on the surface of the substrate which form due to background nitrogen levels in the molecular beam epitaxial growth apparatus. A surface free of amorphous silicon nitride is necessary for formation of high quality AlN.

However, the repetitive provision of alternating fluxes is very time consuming and the effort to create the ultra-high vacuum necessary for the MBE process is very high. To achieve this pressure, which is less than $10^{-12}$ of atmospheric pressure, one needs several vacuum pumps and a long time to pump down. Furthermore, only one wafer can be processed simultaneously and the growth is only about 1 micron per hour.

Therefore, further methods, with which an aluminium nitride layer can be deposited on silicon substrates, are desirable.

A method for depositing an aluminium nitride semiconductor layer on a silicon substrate is provided that comprises providing a silicon substrate; placing the substrate in a vacuum chamber; conditioning a surface of the substrate by etching and providing a conditioned surface; heating the substrate to a temperature $T_1$; depositing an aluminum film onto the conditioned surface of the substrate by a sputtering method under an atmosphere of Argon and depositing an epitaxial aluminium nitride layer on the aluminum film by a sputtering method under an atmosphere of Nitrogen and Argon.

The combination of an etching process to provide a conditioned surface and depositing an aluminum film onto this conditioned surface has been found to facilitate the formation of a essentially Al-terminated silicon substrate. One possible mechanism, by which this feature may be provided, may lie in the formation of an Al-terminated conditioned structure after the etching step which encourages the formation of a N-face polarity aluminium nitride semiconductor layer deposited onto this Al-terminated substrate surface.

In an embodiment, the conditioning the surface of the substrate comprises plasma soft-etching the surface under vacuum. The plasma soft-etching may comprise heating the substrate to a temperature $T_2$, introducing Ar gas into the vacuum chamber and subjecting the surface of the substrate to a plasma. The temperature $T_2$ may lie in the range of 35° C. to 70° C., for example 50° C. In an embodiment, the plasma soft-etching is carried out at a pressure of $2.10^{-4}$ mbar to $8.10^{-4}$ mbar with a RF plasma comprising $Ar^+$ ions. A RF power of 50 W may be used, for example.

The temperature $T_2$ at which the plasma soft-etching is carried out may be less than the temperature $T_1$ of the substrate at which the aluminum film is deposited. $T_1$ may lie in the range of 650° C. to 800° C.

In an embodiment, the silicon substrate is a <111> silicon substrate. It has been shown that that the <111>-Orientation of a silicon substrate may be used to encourage the epitaxial growth of hexagonal AlN.

In an embodiment, the conditioning of the surface of the substrate comprises chemical etching the surface in place of, or in addition to, the plasma soft-etching of the surface.

After the etching, the conditioned silicon surface may be free of native oxides. The etching may comprise preferentially removing chemically bound oxygen from the substrate in order to provide an essentially Si-terminated surface on the silicon substrate.

In an embodiment, the method further comprises flowing Argon (Ar) gas over the substrate whilst the substrate is heated up to the temperature $T_1$. This may aid in preventing the accumulation of contaminants, for example, on the conditioned surface before the aluminum film is deposited onto it.

The method of any one of the embodiments described herein may be carried out in a multiple chamber system such as a cluster tool. In this case, the conditioning may be carried out in a first vacuum chamber and the depositing of the aluminum film and the depositing of the aluminium nitride film layer may be carried out in a second, different, vacuum chamber. The substrate may be transferred between the first and the second chambers via a transfer chamber which is also under vacuum.

After the conditioning, the method may further comprise reducing the pressure in the vacuum chamber. This may be used to clean the vacuum chamber. The pressure in the chamber may also be reduced before the conditioning and/or before the depositing to clean the vacuum chamber.

The sputtering process may be RF magnetron sputtering, DC sputtering or a pulsed DC sputtering.

In an embodiment, the aluminum film is deposited onto the conditioned surface of the substrate by DC sputtering. The target may be an aluminum target, and the process gas may comprise argon. In the case of DC sputtering from an aluminum target, a DC power supply may be used as the power supply for the target. In an embodiment, a DC power of 100 W is used to sputter the aluminum film onto the conditioned surface.

In an embodiment, the aluminium nitride layer is deposited onto the aluminum film by reactive sputtering. The target may be an aluminum target, and the process gas may comprise nitrogen and optionally argon. The nitrogen of the process gas reacts with the aluminum removed or sputtered from the target so as to form an aluminium nitride layer on the aluminium film. In the case of reactive sputtering from an electrically conductive target, a DC power supply may be used as the power supply for the target. In an embodiment, a DC power of 1.0 kW to 3 kW is used to sputter the aluminium nitride layer onto the conditioned surface.

In an embodiment, the aluminium nitride layer is deposited onto the aluminum film by RF sputtering. RF sputtering may be used if the target is non-electrically conductive. For example, the target may comprise the aluminium nitride which is to be deposited onto the aluminum film. In this embodiment, the process gas may be an inert gas such as Argon.

After depositing the aluminium nitride layer, the substrate may be actively cooled. Active cooling may be used to assist in reducing thermal stress on the substrate whilst the substrate cools down.

Embodiments will now be described with reference to the drawings.

One exemplary method for manufacturing a epitaxially grown AlN layer on a silicon substrate comprises: providing <111> silicon substrate and providing a plasma soft-etching at least one surface of this silicon substrate in a vacuum environment. Optionally, after the plasma soft-etching, the cleaned substrate surface may be exposed to nitrogen gas. An aluminum film is sputtered in an atmosphere of argon while keeping the substrate at a temperature above 650° C. After that an aluminium nitride layer is sputtered on the aluminum film.

Figure 1:
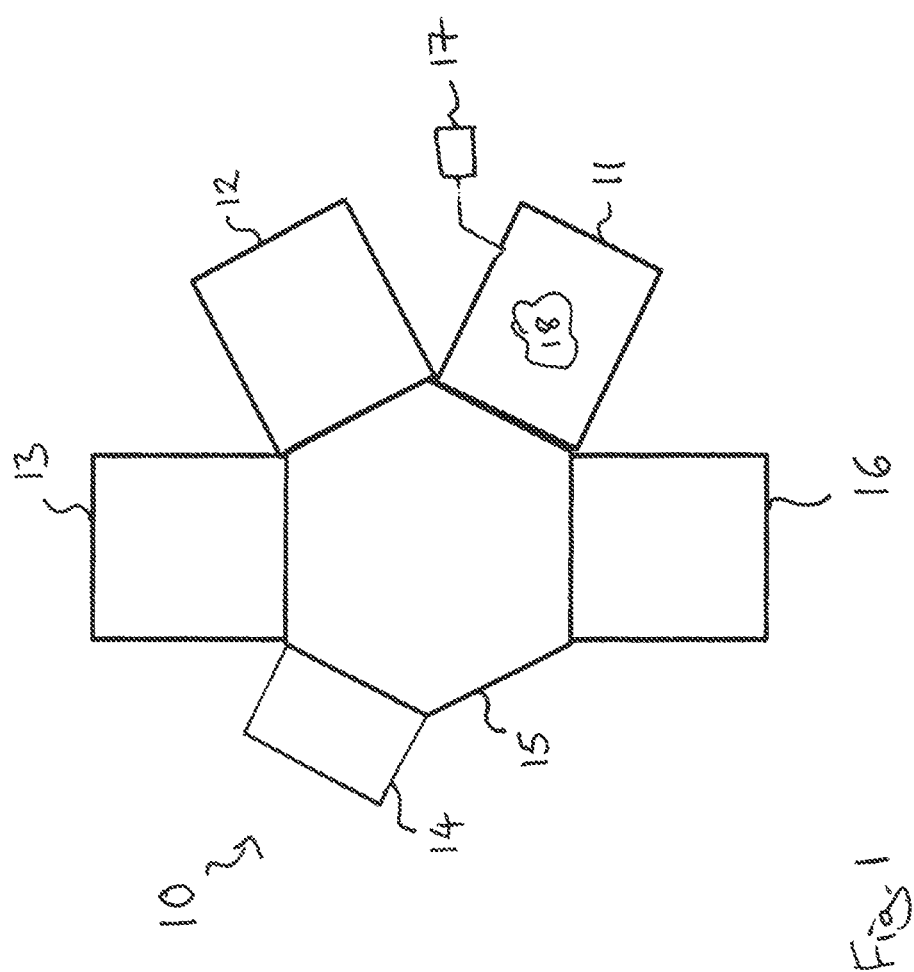
FIG. 1 illustrates a schematic diagram of a semiconductor manufacturing tool comprising several independent process stations.

The methods described herein may be performed in a semiconductor manufacturing tool comprising several independent process stations attached to a common transfer module. FIG. 1 illustrates a schematic diagram of a suitable semiconductor manufacturing tool 10 with four independent process stations 11, 12, 13, 14, a common transfer module 15 and a load lock 16 providing an interface to the ambient. Such a transfer module 15 is an enclosure preferably under vacuum conditions comprising a handling system capable to transfer substrates between the evaluable load lock 16 and the process stations 11, 12, 13, 14. The process stations 11, 12, 13, 14 may have valves allowing them to be isolated from the common transfer module 16 to avoid cross contamination. Such an arrangement of process stations 11, 12, 13, 14 and the common transfer module 15 and the load lock(s) 16 is known in the art as cluster tool. The process chambers 11, 12, 13, 14 may be equipped according to the process to be performed and may include provide for various treatments for substrates such as cleaning, heating, irradiating, depositing, etching and the like.

One of the process stations 11 is used for conditioning the silicon substrate and a further process station 12 is used to deposit the aluminum film by sputtering onto the conditioned surface and to deposit subsequently the aluminium nitride layer by reactive sputtering onto the aluminum film.

The process station 11 comprises a RF power supply 17 for producing a RF plasma 18 comprising Ar+ ions which are used to plasma soft-etch the silicon substrate and produce a conditioned surface which may be free of native oxides.

To condition the surface of the substrate, the substrate is placed in the process station 11, the vacuum chamber pumped down and the temperature of the substrate raised to around 50° C., for example. An argon gas flow is introduced and the RF power supply is switched on to produce a plasma at the surface of the substrate which is used to plasma soft-etch the surface of the substrate and produce a conditioned surface which is—free of native oxides. The substrate is then transferred to the process station 12.

Figure 2:
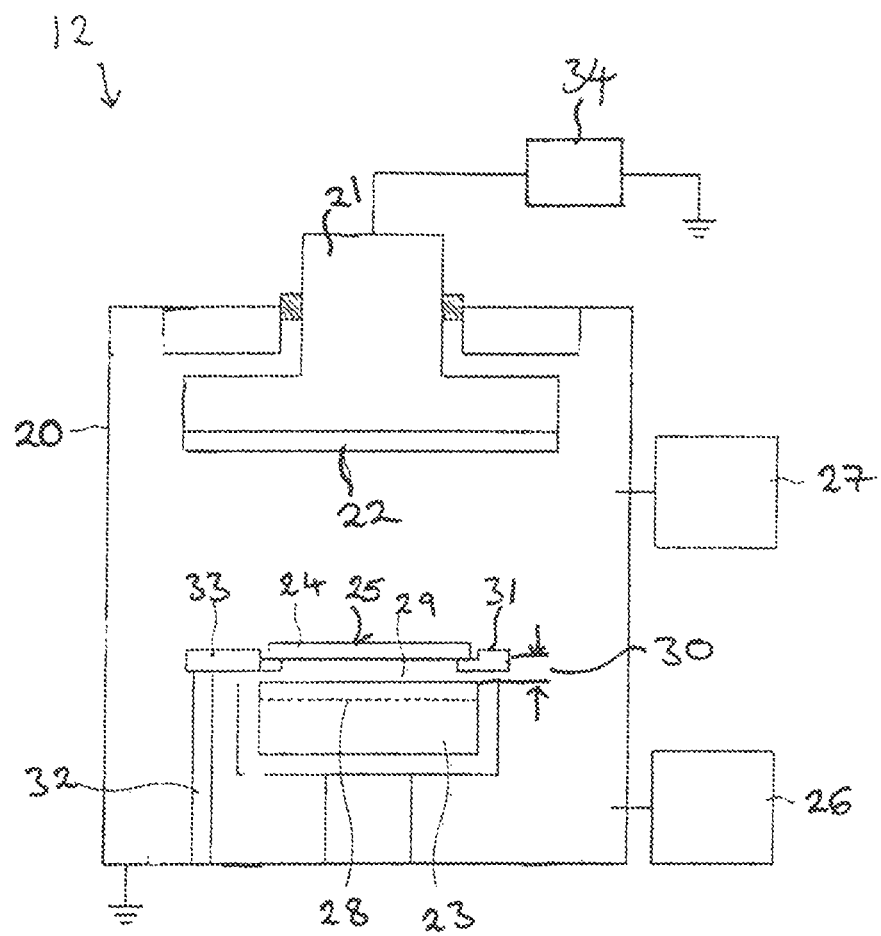
FIG. 2 illustrates apparatus for depositing an aluminum film and an aluminium nitride layer on a substrate.

The process station 12 comprises a target, for example an aluminum target, and a pulsed DC power supply for the aluminum target so as to enable the aluminum film to be deposited using DC sputtering. FIG. 2 illustrates the process station 12 in more detail.

The process station 12 includes a vacuum chamber 20, a target holder 21 supporting a target 22 of aluminum and a heater 23 which is positioned below a substrate 24 with a conditioned surface 25. The process station 12 further comprises nitrogen gas source 26 and an argon gas source 27 from which the process gases may be allowed to flow into the vacuum chamber 20. The heater 23 includes a heater element 28 and a substrate facing surface 29 which is spaced at a predetermined distance 30 from the rear side 31 of the substrate 24. The substrate 24 may be held at the predetermined distance 30 by means of a height adjustable substrate holder 32 having a ring 33 which is used to support the periphery of the rear side 31 of the substrate 24. The substrate 24 is positioned directly opposing the target 22. The target 22 is coupled to a DC power supply 34.

To deposit the aluminum film onto the substrate 24, the vacuum chamber 20 is pumped out, the substrate 24 is heated to a process temperature such as 770° C. by the heater 23. During the heating the substrate 24 argon process gas may be allowed to flow into the vacuum chamber 20 and the DC power supply is applied to the target 22 so that aluminum is sputtered from the target 22 to form an aluminum film on the conditioned surface 25 of the substrate 24.

To deposit aluminium nitride layer onto the aluminum film, the vacuum chamber 20 is pumped out. After that, the nitrogen and argon process gases are allowed to flow into the vacuum chamber 20 and the DC power supply is applied to the target 22 so that aluminum is sputtered from the target 22, reacts with the nitrogen process gas to form an aluminium nitride layer on the conditioned surface 25 of the substrate 24.

One exemplary method comprises the single-substrate-treatment of a 6 inch <111> silicon substrate in an individual treatment chamber. The <111> silicon substrate is introduced into a semiconductor manufacturing tool and transferred to a processing station configured to perform an etching step. The process environment is pumped down to remove unwanted gases and remains of earlier process steps, for example for 10 s, and in parallel the temperature of substrate is adjusted to a temperature $T_2$ which may be about 50° C., for example. Ar gas is introduced, and the pressure and gas flow allowed to stabilize, for example at a chamber pressure of $5\times10^{-4}$ mbar. A substrate surface is soft-etched with Ar ions of the RF plasma. Conditions of about 50 W for 10 s-30 s may be used. Optionally, the chamber may be pumped down to clean from used gases before removal of the substrate from etch process station.

The substrate having a surface conditioned by soft-etching is transferred to a processing station configured to perform an AlN deposition step. The process chamber may be a PVD/ sputtering chamber equipped with an Al target (300 mm diameter) and a pulsed DC power supply. The process environment is pumped down to remove unwanted gases and remains of earlier process steps, for example for 10 s. The substrate is heated up to a temperature $T_1$, which may be in the range of 650-800° C., for example 770° C. The duration of heat up depends on the heater power and time to stabilize the substrate temperature, and may be 100-600 s. Optionally the cleaned and heated surface is exposed to a hydrogen containing gas, e.g. ammonia. Optionally, an Ar gas flow, for example 15 sccm, can be used during heat up. The Ar is introduced and, allowed to stabilize, for example for about 5 s. A thin aluminum film is deposited while controlling flow of Ar. The flow of Ar may be 35 sccm. Sputtering may be carried out using DC power of, for example, 100 W for 4 s which may be sufficient for a thin layer with a thickness of around 0.9 nm.

Then, the process environment is pumped down to remove unwanted gases and remains of this process step, for example for 60 s.

The process gas(es) (Ar and $N_2$) are introduced and, allowed to stabilize, for example for about 10 s. An AlN layer is deposited while controlling flow of $N_2$ and Ar. The flow of $N_2$ may 60 sccm and the flow of Ar may be 30 sccm. Sputtering may be carried out using DC power of, for example, 1.25 kW for 470 s which may be sufficient for a layer with a thickness of 100 nm. The deposition rate is, therefore, about 0.2 nm/s in this embodiment.

Optionally, the process chamber may be pump cleaned from process gas remains. The substrate is allowed to cool, over a time period of 10-300 s for example, to avoid excessive thermal stress for substrate, limitations of handling equipment and the processed substrate is removed from semiconductor manufacturing tool.

Optionally, active cooling before removing the substrate from the processing environment, e.g. in a cooling station, may be performed. The temperature decrease may be adjusted to avoid excessive thermal stress on substrate.

The handling and transfer steps may be executed in other or varying ways. Further, heat up and cool down times are in part dependent on the hardware utilized. They may, depending on respective capabilities, allow for different heat up and cool down times without deviating from the underlying substrate treatment and deposition process.

The deposition of the AlN layer may be performed by RF sputtering and may be formed by RF sputtering with a variation of the RF power.

Some nitridation methods utilize MOCVD and MBE deposition systems, which require the use of nitrogen plasma etching or ammonia exposure at very high temperatures, which are often not suitable for magnetron sputtering. However, nitrogen plasma etching may promote the incorporation of nitrogen by ion bombardment within the silicon substrate and/or the formation of an amorphous oxynitride. One limitation of nitridation by ammonia for magnetron sputtering may be that it would complicate the deposition process due to an additional step.

What is claimed is:

1. A method for depositing an aluminium nitride layer on a silicon substrate, comprising:
    providing a silicon substrate;
    placing the substrate in a vacuum chamber;
    conditioning a surface of the substrate by plasma soft-etching the surface under vacuum by heating the substrate to a temperature $T_2$, introducing Ar gas into the vacuum chamber and subjecting the surface of the substrate to a plasma, and thereby providing a conditioned surface;
    heating the substrate to a temperature $T_1$;
    depositing an aluminum film onto the conditioned surface of the substrate by a sputtering method under an atmosphere of Argon; and
    depositing an epitaxial aluminium nitride layer on the aluminum film by a sputtering method under an atmosphere of Nitrogen and Argon.

2. The method according to claim 1, wherein $T_2$ is 35° C. to 70° C.

3. The method according to claim 1, wherein the plasma soft-etching is carried out at a pressure of $2.10^{-4}$ mbar to $8.10^{-4}$ mbar with a RF plasma comprising $Ar^+$ ions.

4. The method according to claim 1, wherein $T_2 < T_1$.

5. The method according to claim 1, wherein the providing of the silicon substrate includes the providing of a <111> silicon substrate.

6. The method according to claim 1, wherein the conditioning the surface of the substrate comprises chemical etching the surface.

7. The method according to claim 1, wherein the etching comprises removing chemically bound oxygen from the substrate.

8. The method according to claim 1, wherein after the depositing of the aluminum film the surface is mainly Al-terminated.

9. The method according to claim 1, further comprising subjecting the conditioned surface to a hydrogen containing gas flow in the vacuum chamber after the conditioning.

10. The method according to claim 1, wherein $T_1$ lies in the range 650° C. to 800° C.

11. The method according to claim 1, further comprising flowing Argon gas over the substrate whilst the substrate is heated up to the temperature $T_1$.

12. The method according to claim 1, wherein the conditioning is carried out in a first vacuum chamber and the depositing is carried out in a second vacuum chamber.

13. The method according to claim 1, further comprising reducing a pressure in the vacuum chamber after the conditioning.

14. The method according to claim 1, wherein the aluminium nitride film is deposited onto the conditioned surface of the substrate by reactive sputtering.

15. The method according to claim 14, wherein a DC power of approximately 100 W is used to sputter the aluminum film onto the conditioned surface.

16. The method according to claim 1, wherein the aluminium nitride layer is deposited onto the aluminum film by reactive sputtering.

17. The method according to claim 16, wherein a DC power of approximately 1.0 to 3 kW is used to sputter the aluminium nitride layer onto the aluminum film.

18. The method according to claim 1, further comprising actively cooling the substrate after depositing the aluminium nitride layer.

19. A method of producing a layered substrate, comprising:
- providing a silicon substrate;
- placing the substrate in a vacuum chamber;
- conditioning a surface of the substrate by plasma soft-etching the surface under vacuum by heating the substrate to a temperature $T_2$, introducing Ar gas into the vacuum chamber and subjecting the surface of the substrate to a plasma, thereby providing a conditioned surface;
- heating the substrate to a temperature $T_1$;
- depositing an aluminum film onto the conditioned surface of the substrate by a sputtering method under an atmosphere of Argon; and
- depositing an epitaxial aluminium nitride layer on the aluminum film by a sputtering method under an atmosphere of Nitrogen and Argon.

* * * * *